United States Patent
Snitchler et al.

(10) Patent No.: US 6,393,690 B1
(45) Date of Patent: May 28, 2002

(54) STRUCTURE AND METHOD OF MANUFACTURE FOR MINIMIZING FILAMENT COUPLING LOSSES IN SUPERCONDUCTING OXIDE COMPOSITE ARTICLES

(75) Inventors: Gregory L. Snitchler, Shrewsbury; Gilbert N. Riley, Jr., Marlborough; Alexis P. Malozemoff, Lexington; Craig J. Christopherson, South Grafton, all of MA (US)

(73) Assignee: American Superconductor Corpration, Westborough, MA (US)

( * ) Notice: Subject to any disclaimer, the term of this patent is extended or adjusted under 35 U.S.C. 154(b) by 0 days.

(21) Appl. No.: 09/358,167

(22) Filed: Jul. 20, 1999

Related U.S. Application Data

(62) Division of application No. 08/862,016, filed on May 22, 1997, which is a continuation of application No. 08/444,564, filed on May 19, 1995, now abandoned.

(51) Int. Cl.$^7$ .............................................. H01L 39/24
(52) U.S. Cl. ......................... 29/599; 505/431; 505/433
(58) Field of Search ........................... 29/599; 505/431, 505/433

(56) References Cited

U.S. PATENT DOCUMENTS

| | | | |
|---|---|---|---|
| 4,988,669 A | 1/1991 | Dersch | 505/231 |
| 4,990,491 A | 2/1991 | Wagner et al. | 505/231 |
| 4,990,492 A | 2/1991 | Creedon et al. | |

FOREIGN PATENT DOCUMENTS

| | | |
|---|---|---|
| EP | 0 119 553 A1 | 9/1984 |
| EP | 380115 | 8/1990 |
| EP | 0 638 942 A1 | 2/1995 |
| WO | WO 96/28853 | 9/1996 |

Primary Examiner—Carl J. Arbes

(74) Attorney, Agent, or Firm—Fish & Richardson, PC

(57) ABSTRACT

The invention provides a multifilamentary superconducting composite article comprising multiple substantially electrically decoupled domains, each including one or more fine, preferably twisted filaments of a desired superconducting oxide material. In a preferred embodiment, the article comprises a matrix, which substantially comprises a noble metal, a conductive jacketing layer surrounding the matrix, a plurality of discrete filament decoupling layers, each comprising an insulating material, disposed within the matrix to separate the matrix into a plurality of substantially electrically decoupled domains; a plurality of filaments, each comprising a desired superconducting oxide, which are disposed within and essentially encapsulated by the matrix and chemically isolated thereby from the decoupling layers, each of the electrically decoupled domains containing at least one filament. It provides multifilamentary articles that exhibit high DC performance characteristics and AC performance markedly superior to any currently available for these materials. A process and intermediate for making the article are also provided. The article may be manufactured by first, forming a composite intermediate comprising multiple domains, each including one or more fine, preferably twisted filaments of a superconducting oxide or its precursors and then thermomechanically processing the intermediate at conditions sufficient to produce at least one of the effects of texturing, crack healing and, if a precursor to the desired superconducting oxide remains, phase transformation in the filament material under conditions which support the electrical separation of the domains. Preferably, the forming step includes the step of providing filament decoupling layers comprising insulating materials or their predecessors to provide the desired domain separation and most preferably, the insulating material is formed in situ from its predecessor during the thermomechanical processing step. Oxide-forming predecessors are preferred, especially oxide forming materials selected from the group consisting of the transition metals, the alkaline earths, titanium, zirconium, niobium, molybdenum, aluminum, and their alloys. In a preferred embodiment, the desired superconducting oxide material is a member of the bismuth or yttrium families of oxide superconductors.

29 Claims, 9 Drawing Sheets

U.S. PATENT DOCUMENTS

| | | |
|---|---|---|
| 4,994,633 A | 2/1991 | Puhn |
| 5,006,507 A | 4/1991 | Woolf et al. |
| 5,019,555 A | 5/1991 | Chin et al. |
| 5,057,489 A | 10/1991 | Ohkawa et al. |
| 5,073,240 A | 12/1991 | Raggio et al. |
| 5,080,296 A | 1/1992 | Raggio et al. |
| 5,102,865 A | 4/1992 | Woolf et al. |
| 5,108,982 A | 4/1992 | Woolf et al. |
| 5,114,087 A | 5/1992 | Fisher et al. |
| 5,118,663 A | 6/1992 | Woolf et al. |
| 5,122,507 A | 6/1992 | Yamamoto .................. 428/688 |
| 5,123,586 A | 6/1992 | Woolf et al. |
| 5,132,278 A | 7/1992 | Stevens ..................... 505/704 |
| 5,140,006 A | 8/1992 | Woolf |
| 5,149,681 A | 9/1992 | Oshkawa et al. |
| 5,149,684 A | 9/1992 | Woolf et al. |
| 5,164,360 A | 11/1992 | Woolf et al. |
| 5,200,391 A | 4/1993 | Fisher et al. |
| 5,284,825 A | 2/1994 | Stephens et al. |
| 5,419,974 A | 5/1995 | Walters ..................... 428/688 |
| 5,472,527 A * | 12/1995 | Otto et al. |
| 5,501,746 A | 3/1996 | Egawa ........................ 148/98 |
| 5,683,969 A * | 11/1997 | Masur et al. |
| 5,872,081 A | 2/1999 | Woolf |
| 6,038,462 A | 3/2000 | Snitchler et al. |
| 6,066,599 A * | 5/2000 | Otto et al. |

* cited by examiner

STRUCTURE AND METHOD OF MANUFACTURE FOR MINIMIZING FILAMENT COUPLING LOSSES IN SUPERCONDUCTING OXIDE COMPOSITE ARTICLES

CROSS REFERENCE TO RELATED APPLICATIONS

This is a divisional of U.S. patent application Ser. No. 08/862,016, filed May 22, 1997, now pending, which is a Continuation of U.S. patent application Ser. No. 08/444,564, filed May 19, 1995, now abandoned.

BACKGROUND OF THE INVENTION

1. Field of the Invention

This invention relates to superconducting oxide articles having improved characteristics for alternating current operation and to a method for manufacturing them. In particular, the invention relates to composite articles comprising multiple substantially electrically decoupled domains, each containing one or more fine filaments of a superconducting oxide material, and to methods and intermediates for manufacturing such composites.

2. Background of the Invention

Since the discovery of the first oxide superconductors less than a decade ago, there has been great interest in developing high temperature superconducting conductors for use in high current applications such as power transmission cables, motors, magnets and energy storage devices. These applications will require wires and tapes with high engineering critical current densities, robust mechanical properties, and long lengths manufacturable at reasonable cost. Superconducting oxide materials alone do not possess the necessary mechanical properties, nor can they be produced efficiently in continuous long lengths. Superconducting oxides have complex, brittle, ceramic-like structures which cannot by themselves be drawn into wires or similar forms using conventional metal-processing methods. Moreover, they are subject to a magnetic effect known as flux jumping which causes sudden localized temperature variations that can force them out of their superconducting state if it is not compensated. Consequently, the more useful forms of high temperature superconducting conductors usually are composite structures in which the superconducting oxides are supported by a matrix material which adds mechanical robustness to the composite and provides good thermal dissipation in the event of flux jumping. The matrix material chosen must be readily formable, have high thermal conductivity, and be sufficiently non-reactive with respect to the superconducting oxides under the conditions of manufacturing and use that the properties of the latter are not degraded in its presence. For composites made by the popular powder-in-tube or PIT process, described, for example, in U.S. Pat. Nos. 4,826,808, and 5,189,009 to Yurek et al. and W. Gao & J. Vander Sande, Superconducting Science and Technology, Vol 5, pp. 318–326, 1992; C. H. Rosner, M. S. Walker, P. Haldar, and L. R. Motowido, "Status of HTS superconductors: Progress in improving transport critical current densities in HTS Bi-2223 tapes and coils" (presented at conference Critical Currents in High Tc Superconductors', Vienna, Austria, April, 1992) and K. Sandhage, G. N. Riley Jr.,. and W. L. Carter, "Critical Issues in the OPIT Processing of High Jc BSCCO Superconductors", Journal of Metals, 43,21,19, all of which are herein incorporated by reference, the matrix material must also provide sufficient oxygen access during manufacturing to allow the formation of a superconducting oxide from its precursor material. Very few matrix materials meet these requirements. Under normal manufacturing conditions, superconducting oxides have adverse reactions with nearly all metals except the noble metals. Thus, silver and other noble metals or noble metal alloys are typically used as matrix materials, and pure silver is the matrix material generally preferred for most high performance applications although composite matrices, including, for example oxide diffusion barriers or silver layers between superconducting oxides and non-noble metals have been suggested in the prior art.

Many of the superconductor applications that have the greatest potential for energy conservation involve operating the superconductor in the presence of an AC magnetic field, or require that the superconductor carry an AC current. In the presence of time-varying magnetic fields or currents, there are a variety of mechanisms that give rise to energy dissipation, hereafter called AC losses, even in superconductors. Thus, the superconductor geometry must be selected to reduce AC losses, in order to preserve the intrinsic advantage of superconductors, the absence of DC electrical resistance. The physics governing AC losses in low temperature superconducting composite materials have been described and analyzed, c.f. Wilson, *Superconducting Magnets*, Ch 8(1983,1990), W. J. Carr, Jr., AC loss and macroscopic theory of superconductors, Gordon and Breach Science Publishers, New York, 1983, and would be expected to operate in superconducting oxide composites with similar geometries. In general, the primary sources of AC loss are hysteretic loss within the superconducting filament(s),and eddy current loss in the matrix enhanced by coupling between superconducting filament(s). To minimize hysteretic losses, the superconductor is preferably subseparated into many small filaments that are discrete and dimensionally uniform along the length of the conductor. Eddy current losses may be minimized by increasing the electrical resistivity of the matrix or by twisting the filaments, with tighter twist pitches providing lower losses. However, the inherent chemical and mechanical limitations of superconducting oxide composites limit the degree to which these approaches may be relied on for reducing AC losses in high temperature superconducting composites. Conventional methods for increasing the resistivity of the matrix have also been limited. Silver, the matrix material of choice for these composites for the reasons discussed above, has a very low electrical resistivity. Efforts have been made to increase the resistivity of the matrix, for example, by distributing small amounts of oxide-forming metals in finely separated form in a silver matrix, and by using higher resistivity alloys to form all or part of the matrix adjacent to the filaments. However, the presence of even very small amounts of chemically reactive materials near the filament/matrix boundary during the manufacturing process can significantly degrade the properties of the superconducting oxide composite. This is a particularly delicate issue for composites consisting of many fine filaments as the higher surface to volume ratio greatly increases the risk of contamination. In the "PIT" manufacturing process, layers of high resistivity material can also block oxygen access to the filaments during manufacturing, inhibiting the formation of the superconducting oxide from its precursors. In addition increasing the electrical resistivity of the matrix adjacent to the filaments, whether by surrounding the filaments with a resistive layer or by providing a uniformly doped matrix, generally decreases its thermal conductivity, increasing the risk of flux jumping during use.

Thus, an object of the invention is to provide multifilamentary superconducting composite articles in any desired aspect ratio with improved AC loss characteristics and high critical current densities, and a method for manufacturing them.

Another object of the invention is to provide a method of reducing coupling losses in multifilamentary superconducting oxide composite articles without significantly increasing the risk of contamination of the superconducting filaments by the supporting matrix.

Another object of this invention is to provide a method of manufacturing superconducting composite articles suitable for AC applications which provides adequate oxygen access for formation of a desired superconducting oxide with optimal current carrying capacity.

Another object of the invention is to provide highly aspected multifilamentary BSCCO 2212 and 2223 composite conductors having high current densities, superior AC loss characteristics and robust mechanical properties, and a method for producing them.

SUMMARY OF THE INVENTION

In one aspect, the invention provides a multifilamentary superconducting composite article comprising multiple substantially electrically decoupled domains, each including one or more fine, preferably twisted filaments comprising a desired superconducting oxide material. Tapes, wires and other elongated multifilamentary articles are preferred forms of the article. In a preferred embodiment, the article comprises a matrix, at least one discrete filament decoupling layer comprising an insulating material, which is disposed within the matrix to separate the matrix into a plurality of substantially electrically decoupled domains; a plurality of filaments, each comprising a desired superconducting oxide, which are disposed within or around and preferably essentially encapsulated by the matrix and chemically isolated thereby from the decoupling layers, each of the substantially electrically decoupled domains containing at least one filament. The invention provides reductions in coupling losses roughly proportional to the square of the article's cross-sectional ratio. It facilitates the production of multifilamentary articles that exhibit good DC performance characteristics and markedly superior AC performance, particularly in highly aspected forms.

In another aspect, the invention provides an intermediate for a multifilamentary superconducting composite article comprising multiple domains, each including one or more fine, preferably twisted filaments of a superconducting oxide material. In a preferred embodiment, the intermediate comprises a matrix, at least one discrete filament decoupling layer comprising an insulating material or its predecessor, which is disposed within the matrix to separate the matrix into a plurality of substantially separate domains; a plurality of fine, preferably twisted filaments, each comprising a desired superconducting oxide or its precursors, which are disposed within or around and preferably essentially encapsulated by the matrix and chemically isolated thereby from the decoupling layers, each of the separate domains containing at least one filament.

By "filament decoupling layers" are meant discrete layers comprising insulating materials or their predecessors, in geometric forms of sufficient dimension to significantly increase the resistance between domains in the finished article. In the preferred embodiment, each domain is at least partially bounded by the surfaces of one or more filament decoupling layers but the arrangement and materials of the layers are selected so they do not substantially inhibit oxygen access to the filaments in the domain during processing. Typically the filament decoupling layers extend parallel to the filaments along the length of the article, and are very thin in proportion to their width and length. In cross section, they may resemble, for example, fins, donuts, stars, centipedes and combinations of these. In the fully processed article, the thickness of the insulating material is less than the filament thickness, and preferably less than about 5 microns.

By "substantially electrically decoupled domain", as that term is used herein, is meant that the direct high conductivity path between adjacent domains is at least 50% and preferably 85% occluded by the filament decoupling layers, but not more than 100%, preferably not more than 99% and most preferably not more than 95% occluded.

By "insulating material", as that term is used herein, is meant a material with an electrical resistivity high in comparison to that of the matrix material used in the composite under the intended conditions of use. Typically, the insulating material selected will have resistivity at least 10 times higher than that of the selected matrix material. Materials with resistivities greater than about 20 $\mu$-ohm cm may be used, and materials with resistivities greater than about 100 $\mu$-ohm cm are most preferred. Elemental oxides, sulfides, nitrides, semiconductors, intermetallics and other non-metallic insulating materials are suitable. By "predecessor", as that term is used herein, is meant any material that can be converted to an insulating material by heat treatment under suitable conditions. Metals with high oxidation rates, particularly the transition metals, the alkaline earths, thallium, zirconium, niobium, molybdenum, aluminum and their alloys are preferred predecessor materials, and zirconium, niobium, molybdenum, hafnium, tantalum, tungsten, titanium, vanadium, manganese, cobalt, iridium, vanadium nickel,iron and chromium are particularly preferred. Zirconium, niobium, nickel,iron and molybdenum are most preferred.

By "matrix" as that term is used herein, is meant a material or homogeneous mixture of materials which supports or binds a substance, specifically including the filaments, disposed within or around the matrix. By "noble metal", as that term is used herein, is meant a metal which is substantially non-reactive with respect to oxide superconductors and precursors and to oxygen under the expected conditions (temperature, pressure, atmosphere) of manufacture and use. "Alloy" is used herein to mean an intimate mixture of substantially metallic phases or a solid solution of two or more elements. Silver and other noble metals are the preferred matrix materials, but alloys substantially comprising noble metals, including ODS silver, may be used.

In a preferred embodiment, a conductive jacketing layer surrounds the article. Noble metals and alloys comprising noble metals, including ODS silver, are the most preferred jacketing layer materials, but other conductive materials, including composites of several different metals, may be used. Jacketing layers made from a material with a resistivity at least equal to that of the matrix material may be used, and jacketing layers with a resistivity on the order of about 0.5–10 $\mu$ohm are especially preferred.

By "desired oxide superconductor", as that term is used herein, is meant the oxide superconductor intended for eventual use in the finished article. Typically, the desired oxide superconductor is selected for its superior electrical properties, such as high critical temperature or critical current density. Members of the bismuth and rare earth families of oxide superconductors are preferred. By "precursor", as that term is used herein, is meant any material that can be converted to a desired oxide superconductor upon application of a suitable heat treatment. By "fine filaments" are meant filaments with a cross-sectional dimension less than 750 and preferably less than 150 microns.

In yet another aspect, the invention provides a method of manufacturing a multifilamentary superconducting composite article having improved AC loss properties by first, forming a composite intermediate comprising multiple domains, each including one or more fine, preferably twisted filaments of a superconducting oxide material or its precursor, and then thermomechanically processing the intermediate at conditions sufficient to produce at least one of the effects of texturing, crack healing and, if a precursor to the desired superconducting oxide remains, phase transformation in the filament material under conditions which support the electrical separation of the domains. In the preferred embodiment, the forming step includes the step of providing filament decoupling layers comprising insulating materials or their predecessors to provide the desired domain separation, and in the most preferred embodiment, the insulating material is formed in situ from its predecessor during the thermomechanical processing step.

In one preferred embodiment, the forming step includes the steps of forming composite comprising a matrix, which substantially comprises a noble metal, a plurality of discrete filament decoupling layers disposed within the matrix to separate the matrix into a plurality of substantially separate domains, each layer comprising an insulating material or its predecessor, and a plurality of filaments, each comprising a desired superconducting oxide or its precursors, which are disposed within or around and preferably essentially encapsulated by the matrix and chemically isolated thereby from the decoupling layers, each of the domains containing at least one filament; and next, deforming the intermediate to produce at least one of the effects of twisting the filaments and texturing the material comprised therein. By "texturing", as that term is used herein, is meant inducing crystallographic alignment and intergrain bonding of the grains of a desired superconducting oxide or its precursors. In a preferred embodiment, the forming step includes the steps of forming filament decoupling layers from an oxide-forming predecessor to an oxide insulating material and the thermomechanical processing step comprises the steps of, first, heat treating the composite at conditions sufficient to passivate the predecessor and form an insulating material from at least part of the predecessor material but not to induce substantial phase transformation in the filament material; and, thereafter thermomechanically processing the composite at conditions sufficient to produce at least one of the effects of texturing, crack healing and, if a precursor to the desired superconducting oxide remains, phase transformation in the filament material. In a preferred embodiment, the process also includes the step of providing a conductive jacketing layer surrounding the article.

DETAILED DESCRIPTION OF THE PREFERRED EMBODIMENTS

Figure 1:
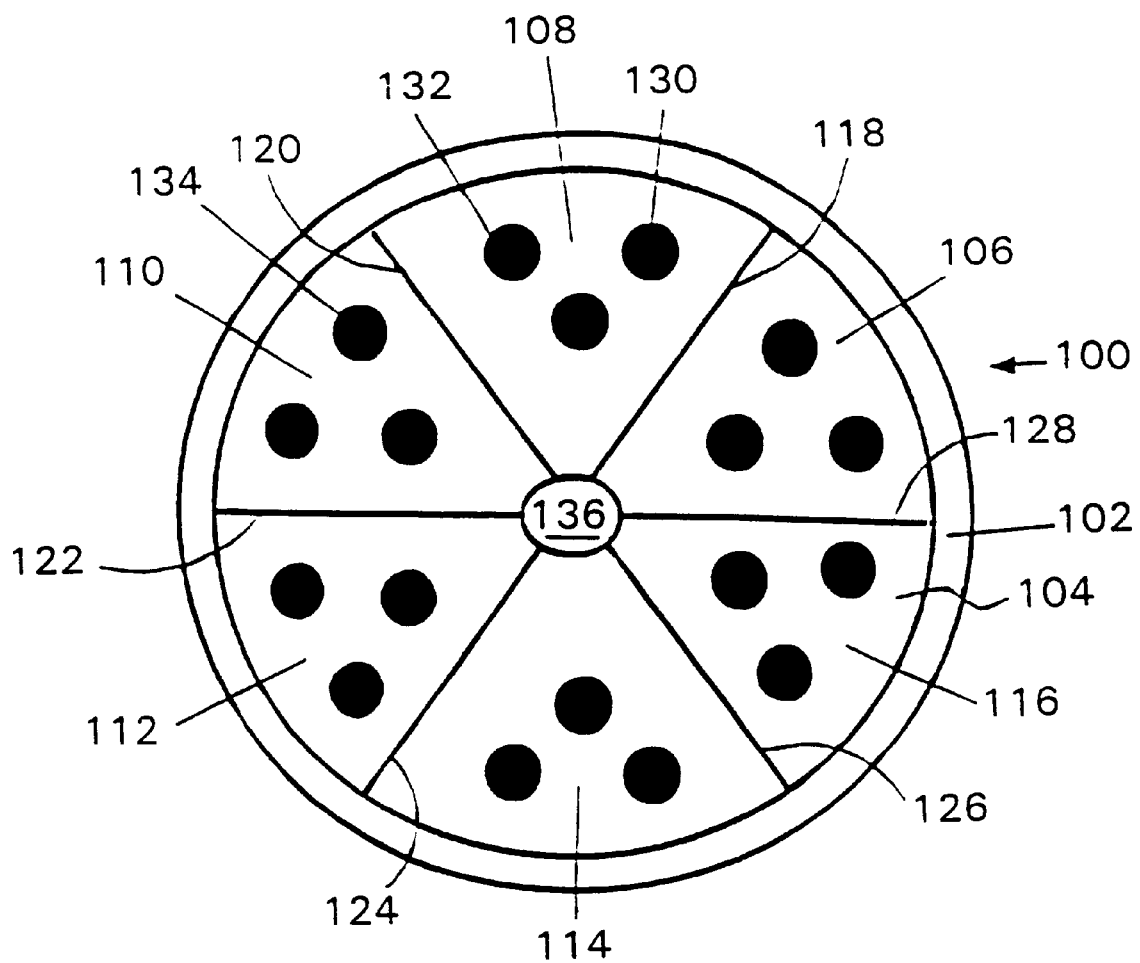
FIG. 1 is a photograph of the cross-section of a composite article made in accordance with one aspect of the invention.

In one aspect, the invention provides a multifilamentary superconducting composite article comprising multiple substantially electrically decoupled domains, each including one or more fine, preferably twisted filaments comprising a desired superconducting oxide material. By "substantially electrically decoupled domain", as that term is used herein, is meant that the direct high conductivity path between adjacent domains is at least 50% and preferably 85% occluded, but not more than 100%, preferably not more than 99% and most preferably not more than 95% occluded. Electrical separation of the domains is preferably provided by filament decoupling layers. By "filament decoupling layers" are meant discrete layers comprising insulating materials or their predecessors, in geometric forms of sufficient dimension to significantly increase the resistance between domains in the finished article. In the preferred embodiment, each domain is at least partially bounded by the surfaces of one or more filament decoupling layers but the arrangement and materials of the layers are selected so they do not substantially inhibit oxygen access to the filaments in the domain during processing. Typically, the filament decoupling layers extend parallel to the filaments along the length of the article, although they may be discontinuous or broken at intervals, and are very thin in proportion to their width and length. The layers may be connected to one another along their length to partially or fully surround one or more filaments. If the filaments are twisted, by which is meant any form of transposition around the longitudinal axis of the article, the filament decoupling layers may also be twisted. If the filament decoupling layers are discontinuous, a period of discontinuity greater than the period of the twist is preferred. In lateral cross-section, they may resemble, for example, fins, donuts, stars, centipedes and combinations of these. Configurations such as the star-in-star illustrated in FIG. 3, the bag-of-donuts illustrated in FIG. 7, and the centipede illustrated in FIG. 8 are particularly preferred. Any number of filament decoupling layers, and any number of filaments may be used in any of these configurations. Preferred configurations contain large numbers of filament decoupling layers and small numbers of filaments in each domain, with one filament per domain being the most preferred configuration.

Typically, the filaments and filament decoupling layers will both be supported by a matrix material. Most typically, both will be embedded in and chemically isolated by the matrix material, although other arrangements, such as alternating strata of matrix material, filament decoupling layers and filaments are also within the scope of the invention. In the fully processed composite article, the filament decoupling layers must comprise material which is insulating and also inert to the superconducting oxide and to the matrix under conditions of normal use, such as a metal oxide. In addition, the material for the filament decoupling layer, in either its final or a predecessor form, must be able to survive the physical deformations and high temperatures of typical superconducting composite manufacturing processes, such as the PIT process, without impairing the properties of the composite. During the deformation processing stage, it must be flexible, and preferably malleable. During the heat treatment stage, it must not migrate in sufficient quantity to poison the superconducting material.

Because superconducting composites can carry large currents at very low voltages, insulating materials with a broad range of electrical properties may be used. The insulating material selected should have an electrical resistivity greater than 20 $\mu$ohm cm. Materials with resistivities at least 100 times higher than that of the matrix material used in the composite under the intended conditions of use, i.e. at cryogenic temperatures, are preferred. In the fully processed article, the thickness of the insulating material should be less than the filament thickness, and preferably between about 0.01–5 microns, with the range between about 0.1–1 microns being most preferred.

Although insulating materials such as elemental oxides, sulfides, and nitrides, semiconductors and intermetallics, which remain essentially inert throughout the composite manufacturing process may be used to form the decoupling layers of the present invention, in a preferred embodiment of the invention, the filament decoupling layers are formed in situ by oxidation of a metal layers during the composite manufacturing process. The transition metals, the alkaline earths, thallium, zirconium, niobium, molybdenum, aluminum and their alloys are preferred predecessor materials, and zirconium, niobium, molybdenum, hafnium, tantalum, tungsten, titanium, vanadium, manganese, cobalt, iridium, vanadium, nickel, iron and chromium are particularly preferred. Zirconium, niobium, nickel, iron and molybdenum are most preferred.

A preferred embodiment of the invention is illustrated in FIG. 1. The figure shows a composite article 100 comprising a conductive jacketing layer 102 surrounding a matrix 104, which substantially comprises a noble metal. A plurality of discrete filament decoupling layers 118, 120, 122, 124, 126, 128, 136 are embedded in the matrix in an arrangement that separates the matrix into a plurality of, and preferably at least three, separate domains 106, 108, 110, 112, 114, 116. Each decoupling layer is comprised of an insulating material. In the fully processed article, the decoupling layers separate the matrix into a plurality of substantially electrically decoupled domains. A plurality of filaments, 130, 132, 134, each comprising a desired superconducting oxide or its precursors, are also embedded within the matrix 104, so arranged that each domain includes at least one filament, but each filament is essentially encapsulated by the matrix. Thus, the matrix chemically isolates each filament from the decoupling layers and from any neighboring filaments.

The invention may be practiced with any desired oxide superconductor or its precursors. By "desired oxide superconductor" is meant the oxide superconductor intended for eventual use in the finished article. Typically, the desired oxide superconductor is selected for its superior electrical properties, such as high critical temperature or critical current density. By "precursor" is meant any material that can be converted to an oxide superconductor upon application of a suitable heat treatment. Precursors may include any combination of elements, metal salts, oxides, suboxides, oxide superconductors which are intermediate to the desired oxide superconductor, or other compounds which, when reacted in the presence of oxygen in the stability field of a desired oxide superconductor, produces that superconductor. For example, there may be included elements, salts, or oxides of copper, yttrium or other rare earths, and barium for the rare earth family of oxide superconductors; elements or oxides of copper, bismuth, strontium, and calcium, and optionally lead, for the BSCCO family of oxide superconductors; elements, salts, or oxides of copper, thallium, calcium and barium or strontium, and optionally, bismuth and lead, for the thallium (TBSCCO) family of oxide superconductors; elements, salts, or oxides of copper, mercury, calcium, barium or strontium, and optionally, bismuth and lead, for the mercury (HBSCCO) family of oxide superconductors. The bismuth and rare earth families of oxide superconductors are most preferred for operation of the invention. By "oxide superconductor intermediate to the desired oxide superconductor" is meant any oxide superconductor which is capable of being converted to the desired oxide superconductor. The formation of an intermediate may be desired in order to take advantage of desirable processing properties, for example, a micaceous structure, which may not be equally possessed by the desired superconducting oxide. Precursors are included in amounts sufficient to form an oxide superconductor. In some embodiments, the precursor powders may be provided in substantially stoichiometric proportion. In others, there may be a stoichiometric excess or deficiency of any precursor to accommodate the processing conditions used to form the desired superconducting composite. For this purpose, excess or deficiency of a particular precursor is defined by comparison to the ideal cation stoichiometry of the desired oxide superconductor. Thalliation, the addition of doping materials, including but not limited to the optional materials identified above, variations in proportions and such other variations in the precursors of the desired superconducting oxides as are well known in the art, are also within the scope and spirit of the invention.

The three-layer, high-Tc phase of a member of the BSCCO family of superconductors (BSCCO 2223), such as $Bi_2Sr_2Ca_2Cu_3O_x$ or $(Bi, Pb)_2Sr_2Ca_2Cu_3O_x$, is one of the desire superconducting oxide most preferred for the operation of the present invention. Composites including BSCCO 2223 have demonstrated the potential for superior mechanical and electrical performance at long lengths when adequately textured. The current-carrying capacity of a superconducting oxide composite depends significantly on the degree of crystallographic alignment and intergrain bonding of the oxide grains, together known as "texturing", induced during the composite manufacturing operation. For example, known techniques for texturing the two-layer and three-layer phases the bismuth-strontium-calcium-copper-oxide family of superconductors (BSCCO 2212 and BSCCO 2223, respectively) are described in Tenbrink, Wilhelm, Heine and Krauth, Development of Technical High-Tc Superconductor Wires and Tapes, Paper MF-1, Applied Superconductivity Conference, Chicago(Aug. 23–28,1992), and Motowidlo, Galinski, Hoehn, Jr. and Haldar, Mechanical and Electrical Properties of BSCCO Multifilament Tape Conductors, paper presented at Materials research Society Meeting, Apr. 12–15, 1993. The highest reported performance for BSCCO 2223 multifilamentary composite conductors has been obtained in highly aspected forms containing flattened filaments with high aspect ratios. For untwisted or loosely twisted conductors, the AC losses in a highly aspected tape are increased over the losses from a round wire of equal cross-sectional area by (to a zero order approximation) the square root of the tape's aspect ratio.

Thus, a tape with a 9:1 aspect ratio will have about 81 times the losses of a round wire of equal cross-sectional area. The high aspect ratios of the flattened filaments also cause increased hysteretic losses in transverse magnetic fields. If, as is typical, the tape is obtained by deforming a round billet, filaments of equal dimension will also be non-uniformly flattened by the texturing process, with significantly greater flattening and DIT texturing of filaments at the center of the tape than of filaments at the periphery of the tape and non-uniform distances between filaments causing undesirable asymmetries in current carrying capability and additional AC loss effects.

The inventors have found that the division of the matrix into a plurality of substantially electrically decoupled domains substantially improve the AC loss characteristics of the superconducting composite article. The effect is particularly pronounced for highly aspected superconducting oxide composites, which have large eddy current coupling losses when exposed to changing magnetic fields normal to their wide faces. The inventors believe that, by analogy to Carr's anisotropic continuum model for losses in a multistrand Rutherford cable, W. J. Carr, Jr. and V. T. Kovachev, "Interstrand eddy current losses in SSC magnets," Cryogenics, submitted 1994, the losses in the filamentimatrix region of an aspected superconducting composite composed of multiple domains can be approximated by a term representing the normal conductance between adjacent filaments within a domain $$\frac{B_\perp^2 w^2}{12\rho_n}\left(1 + \frac{L^2}{4w^2}\right)$$

plus a term representing the coupling losses along the domain boundaries $$\frac{B_\perp^2 L^2}{64}\beta^2 \frac{1}{\rho_\perp}\frac{w^2}{d^2}.$$

In addition, the conductive jacket will have standard eddy current losses, which can be approximated by $$P_j \approx \frac{B_\perp^2 vw}{2\rho}\frac{v}{d}$$

when the thickness of the jacketing layer is much smaller than the strand dimensions. If the layer separating adjacent domains is an insulator whose resistivity far exceeds the resistivity within the domain, $P_{perp}$ will be very low in comparison to $P_n$, or $P_j$ and may be ignored. If one surface of the domain is bounded by a portion of the jacketing layer, then in the simplest case where only one filament is found in each domain, the normal coupling $P_n$ will take place through the jacketing layer rather than through the filament decoupling layers, and may be represented by $$\frac{B_\perp^2 vw^2}{6d\rho_m}\left(1 + \frac{L^2}{4w^2}\right).$$

This simplified case will be approximated whenever there are relatively few filaments per domain and the filament decoupling layers have a resistivity at least 100 times greater than that of the matrix. Thus, selective use of discrete filament decoupling layers made from insulating materials to establish substantially electrically isolated domains significantly improves the AC loss characteristics of the multifilamentary composite.

In yet another aspect, the invention provides a method of manufacturing a multifilamentary superconducting composite article having improved AC loss properties by first, forming a composite intermediate comprising multiple domains, each including one or more fine, preferably twisted filaments of a superconducting oxide material or its precursor, and then thermomechanically processing the intermediate at conditions sufficient to produce at least one of the effects of texturing, crack healing and, if a precursor to the desired superconducting oxide remains, phase transformation in the filament material under conditions which support the electrical separation of the domains. In the preferred embodiment, the forming step includes the step of providing filament decoupling layers comprising insulating materials or their predecessors to provide the desired domain separation.

Although the invention may be used to manufacture these composite articles by processes such tape casting, dip coating, and a variety of sputtering and vapor deposition processes, it is particularly well-adapted for manufacturing processes, such as powder-in-wire or the well-known powder in tube (PIT) process, in which the filament material is converted from precursor to desired superconducting oxide while in intimate contact with an enclosing matrix. The matrix material selected must be readily formable and must be sufficiently non-reactive with respect to the superconducting material that the latter's properties are not substantially degraded in its presence. Moreover, it must allow good oxygen access to the filaments under the expected manufacturing conditions to facilitate formation of the desired superconducting oxides from their precursors. Metals which are noble in that they are substantially non-reactive with respect to oxide superconductors and their precursors and to oxygen under the expected conditions (temperature, pressure, atmosphere) of manufacture and use are preferred, although alloys substantially comprising these metals, including oxide dispersion strengthened (ODS) silver, may also be used. Preferred noble metals include silver (Ag), gold (Au), platinum (Pt) and palladium (Pd). Silver and its alloys, being lowest in cost of these materials, are most preferred for large-scale manufacturing.

Figure 2:
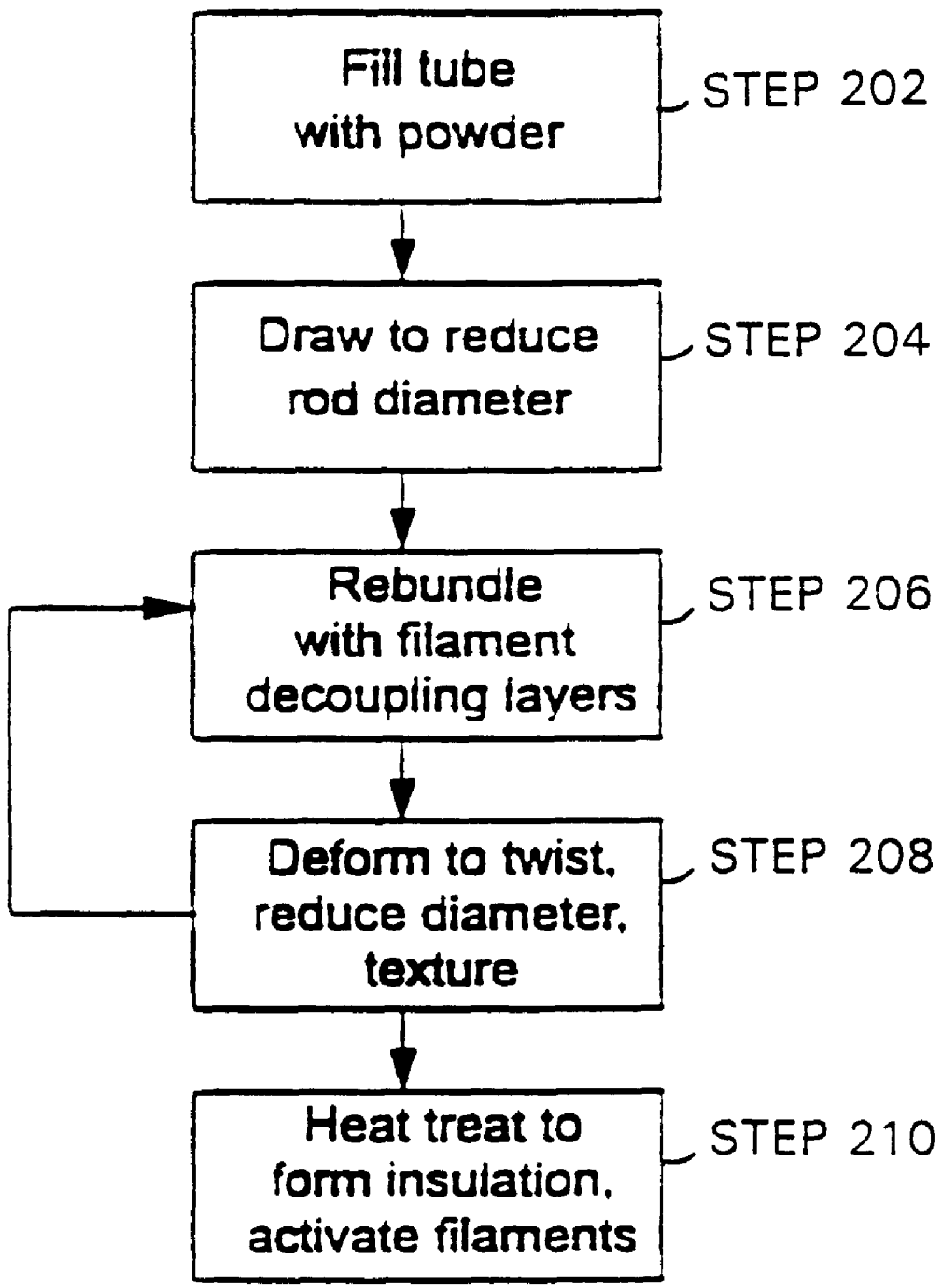
FIG. 2 is a process flow diagram illustrating the manufacture of the composite article of FIG. 1 in accordance with one aspect of the present invention.

FIG. 2 shows a process flow diagram for manufacturing a composite article, such as that shown in FIG. 1, using PIT techniques in accordance with one aspect of the present invention. In step 202, a monofilamentary rod is formed by packing a precursor oxide powder into a metal container, such as a silver tube. In step 204, the metal containers are deformation processed to form monofilamentary rods of reduced diameter. In step 206, a bundling step, a number of the rods are assembled in some close packed or other symmetric arrangement to form a multifilamentary composite. Filament decoupling layers are inserted among the rods in a predetermined geometry during the bundling step. The layers may be in the form of sheets, foils, cores, or other shapes depending on the ultimate geometry desired. (For economies of scale, it is preferred that the decoupling layers be assembled into the composite at a relatively early stage of the manufacturing process, while the desired superconducting oxide is still in its more malleable precursor stage, but this is not required for the practice of the invention.) In accordance with a preferred embodiment of the present invention, filament decoupling layers of predecessor materials such as oxide forming materials selected from the group consisting of the transition metals, the alkaline earths, titanium, zirconium, niobium, molybdenum, aluminum, and their alloys, may be selected. In accordance with another preferred embodiment of the invention, filament decoupling layers of insulating materials such as alumina or other metal oxides, nitrides, sulfides, semiconductors or intermetallics may be selected. Step 206 is followed in step 208 by further deformation processing including longitudinal reductions and, for AC applications, preferably twisting, to form a multifilamentary intermediate having the desired number of filaments. A preferred deformation sequence is drawing, then twisting, then rolling, but other deformation sequences may be used.

Figure 3:
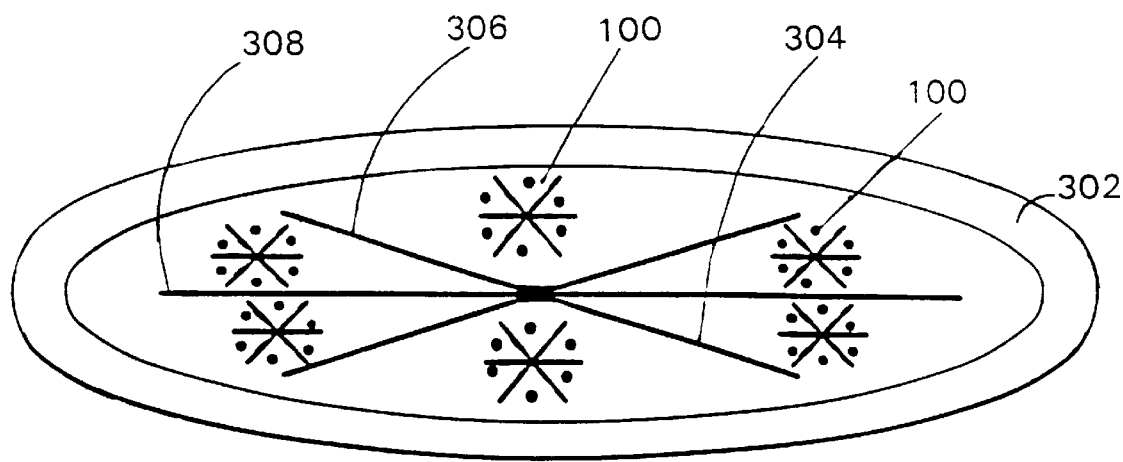
FIG. 3 is a schematic diagram of the cross-section of a composite article made in accordance with another preferred embodiment of the invention.

Steps 206 and 208 may be repeated as many times as desired, with the insertion of additional filament decoupling layers at each iteration, to provide an intermediate composite of reduced cross-section including the desired number of domains each defined by one or more filament decoupling layers and containing one or more twisted filaments of precursor material in intimate contact with a surrounding matrix, which substantially comprises a noble metal. From one to five rebundling iterations are preferred. Turning now to FIG. 3, a highly aspected superconducting tape 300 is shown, which may be manufactured by rebundling intermediates with one filament per domain, made in the general form of intermediate 100 shown in FIG. 1 above with additional decoupling layers 304, 306, 308, and inserting the whole ensemble into a jacketing layer 302 for deformation and thermomechanical processing as described above.

The conductive jacketing layers shown in FIGS. 1 and 3 may be added to the intermediate during or after steps 206, 208, or 210. The material for the jacketing layer must have an electrical resistivity at least equal to, and preferably 10 times that of the matrix material. Resistivities on the order of 0.5–10 $\mu$ohm cm are especially preferred. However, because the jacketing layer is chemically isolated from the filaments by the matrix, it may be somewhat reactive with respect to the superconducting material under expected manufacturing conditions. In the preferred embodiments made using a PIT process, it must also be readily formable and must allow good oxygen access to the filaments under the expected manufacturing conditions. Preferred jacketing materials include silver and other noble metals, and their alloys, particularly ODS silver and silver-gold alloys. In one embodiment, the matrix and jacketing layer may be formed simultaneously from the same noble metal, and a post-processing step added to increase the resistivity of the jacketing layer by, for example, ion bombardment.

In step 210, the intermediate is thermomechanically processed at conditions sufficient to produce at least one of the effects of texturing, crack healing and, if a precursor to the desired superconducting oxide remains, phase transformation in the filament material under conditions which support the electrical separation of the domains. In the preferred embodiment in which the filament decoupling layers comprise a predecessor to an insulating material, the intermediate is thermomechanically processed at conditions sufficient to produce at least one of the effects of passivating any predecessor material and forming an insulating material in the decoupling layers and texturing, crack healing and, if a precursor to the desired superconducting oxide remains, phase transformation in the filament material. Typically, in this case, the thermomechanical processing step comprises the steps of first heat treating the composite at conditions sufficient to passivate the predecessor and form an insulating material from at least part of the predecessor material but not to activate the filament materials, and, thereafter activating the filaments by thermomechanical treatment at conditions sufficient to produce at least one of the effects of texturing, crack healing and, if a precursor to the desired superconducting oxide remains, phase transformation in the filament material. By "conditions which activate the filament materials" are meant conditions which enable substantial chemical and/or thermodynamic phase transformations in these materials (but not the matrix). By "texturing", as that term is used herein, is meant inducing crystallographic alignment and intergrain bonding of the grains of a desired superconducting oxide or its precursors.

In one preferred embodiment of the invention, the preliminary heat treatment step is continued until the metal predecessor layers are essentially passivated by thorough oxidation of the interface between the metal predecessor layers and the adjoining matrix before any substantial thermomechanical activation of the precursors takes place. Passivation may take place either by formation of an oxide scale on these surfaces or by essentially complete oxidation of the entire metal predecessor layer. For intermediates containing precursors to the copper oxide high temperature superconductors, preliminary heat treatment in an oxidizing atmosphere at a temperature of less than about 700 degrees C, and preferably less than about 550 C, for up to 100 hours has been found to adequately oxidize the predecessor layers under conditions where the precursors are kinetically limited. Thermomechanical activation of the intermediate may then be performed in accordance with conventional PIT processing methods.

In another preferred embodiment of the invention, passivation may not be completed until thermomechanical activation of the precursors has begun, but the predecessor materials and passivation conditions may be selected so that the oxygen flux associated with the passivation reactions does not interfere with the desired phase evolution of the precursors, for example, by annealing at very high oxygen pressures, preferably greater than about 10 atmospheres.

Figure 4:
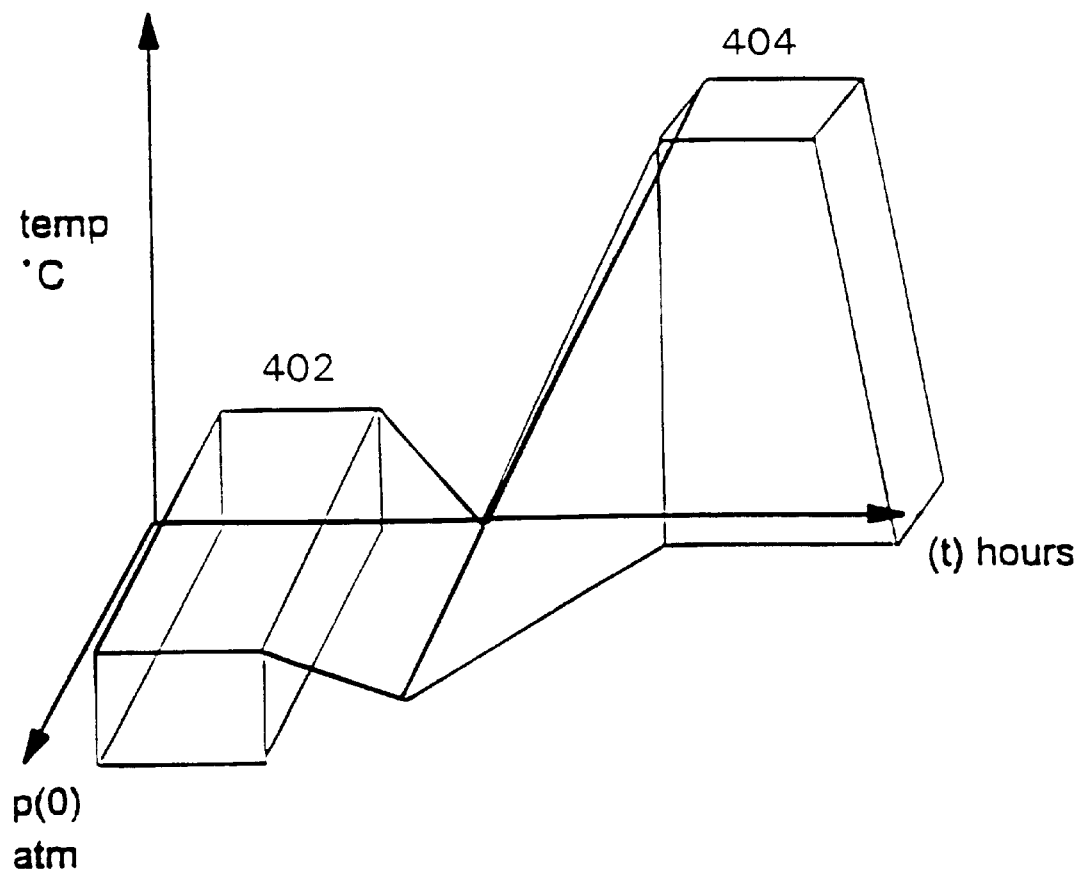
FIG. 4 is a processing profile of a heat treatment sequence in accordance with one aspect of the invention.
Figure 5:
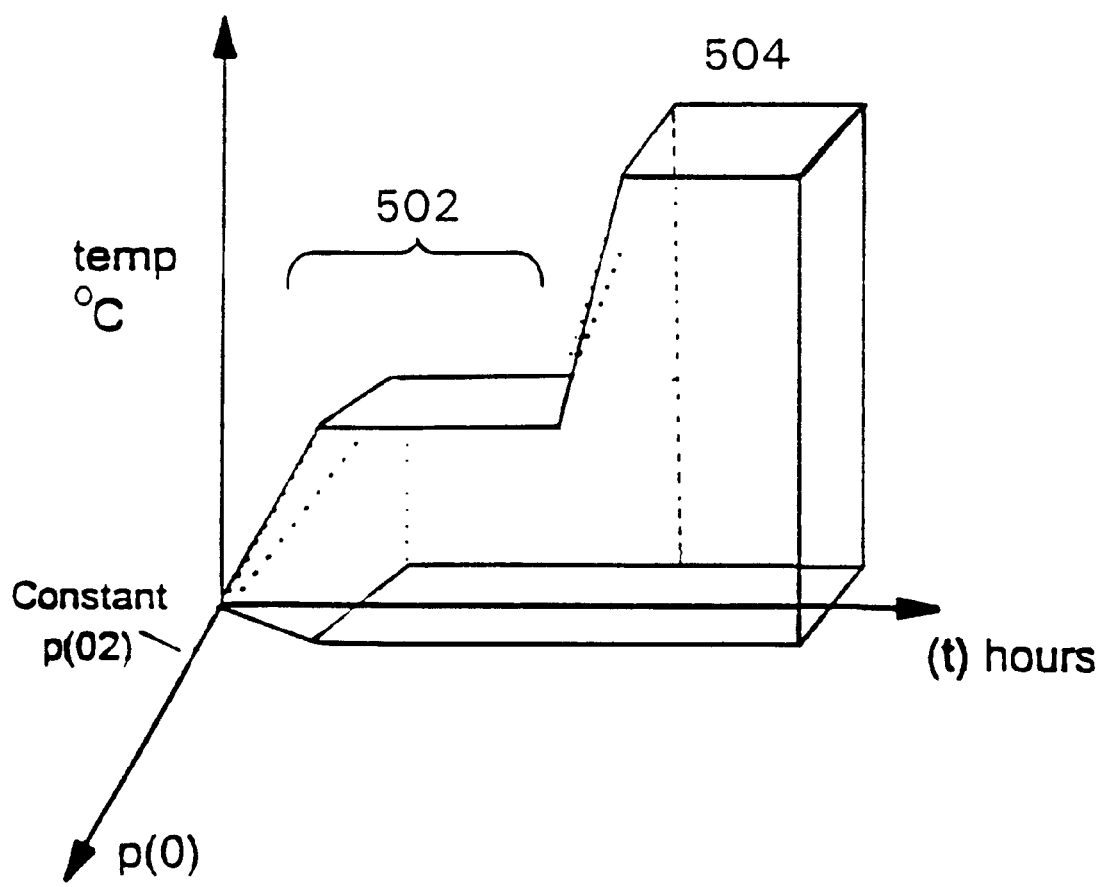
FIG. 5 is a processing profile of a heat treatment sequence in accordance with another aspect of the invention.
Figure 6:
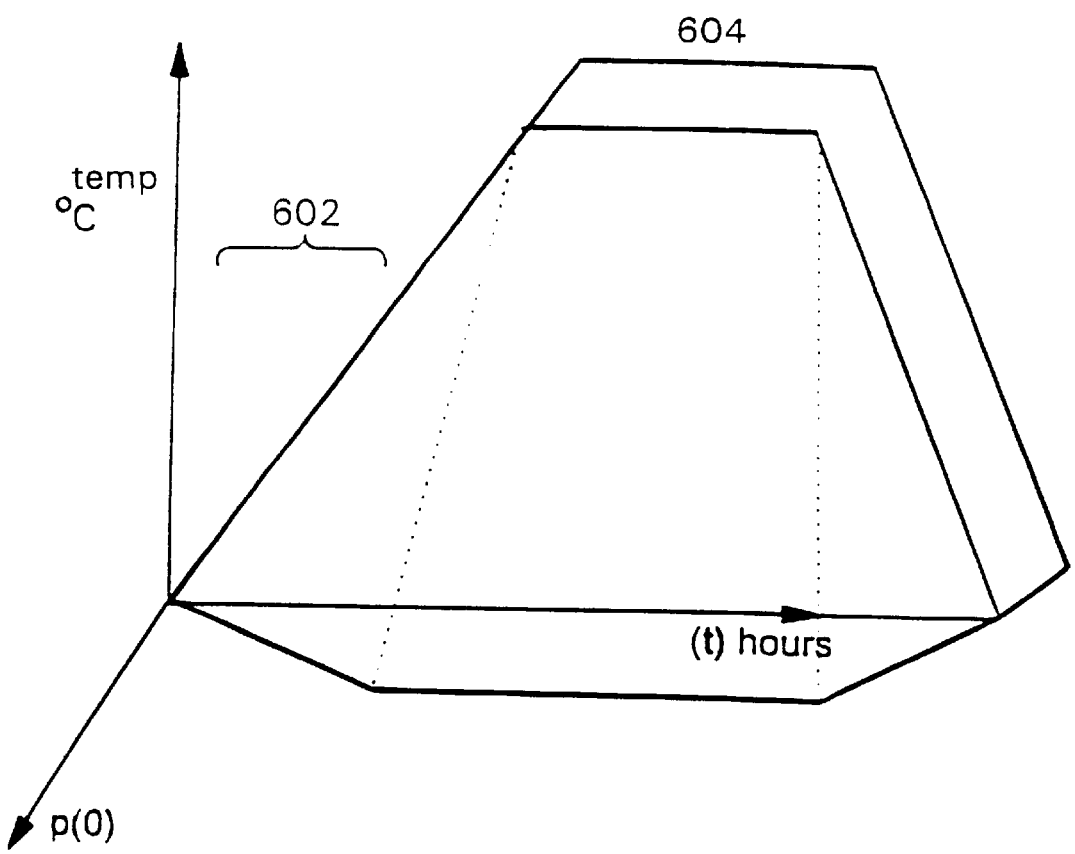
FIG. 6 is a processing profile of a heat treatment sequence in accordance with yet another aspect of the invention.

FIGS. 4, 5 and 6 are schematic diagrams of three alternative processing sequences for the preliminary heat treatment and thermomechanical filament activation steps in accordance with these preferred embodiments of the invention. As shown in FIG. 4, a separate preliminary heat treatment step 402 may be done at a fixed temperature prior to the initiation of thermomechanical activation 404. Alternatively, the preliminary heat treatment may take place during the ramp-up 502 to thermomechanical activation conditions, 504, with one or more plateaus, as illustrated by FIG. 5, or continuously, but at a very slow ramp rate, preferably less than 10 C/min as illustrated by 602 in FIG. 6. In each processing sequence, the duration of the preliminary heat treatment step will determine whether the predecessor is fully passivated prior to activation of the filament material. Upon completion of passivation, at whatever point in the sequence this takes place, thermomechanical activation may be continued as required to obtain optimal performance in the superconducting composite.

In the preferred embodiment in which the filament decoupling layers comprise an insulating material, the thermomechanical processing step comprises the step of texturing, crack healing and, if a precursor to the desired superconducting oxide remains, phase transformation in the filament material at conditions selected so that any activation of the insulating material does not significantly impair its insulating properties or interfere with the desired phase transformations of the filament materials. In this embodiment, selection of an appropriate insulating material is essential. In addition to high relative resistivity and inertness to both the filament material and the matrix material under the conditions of manufacture, the insulating material must be flowable enough to handle the substantial deformations typical of superconducting composite manufacturing processes. Relatively few insulating materials possess either a work hardening rate or a strain rate sensitivity which provide sufficient flowability in combination with the other required characteristics. Powders or bulk forms of boron nitride, tungsten carbide, titanium carbide, silicon carbide, alumina, silicon nitride, boron carbide, zirconium oxide, titanium nitride, yttrium oxide, or magnesium oxide may be used.

Figure 7:
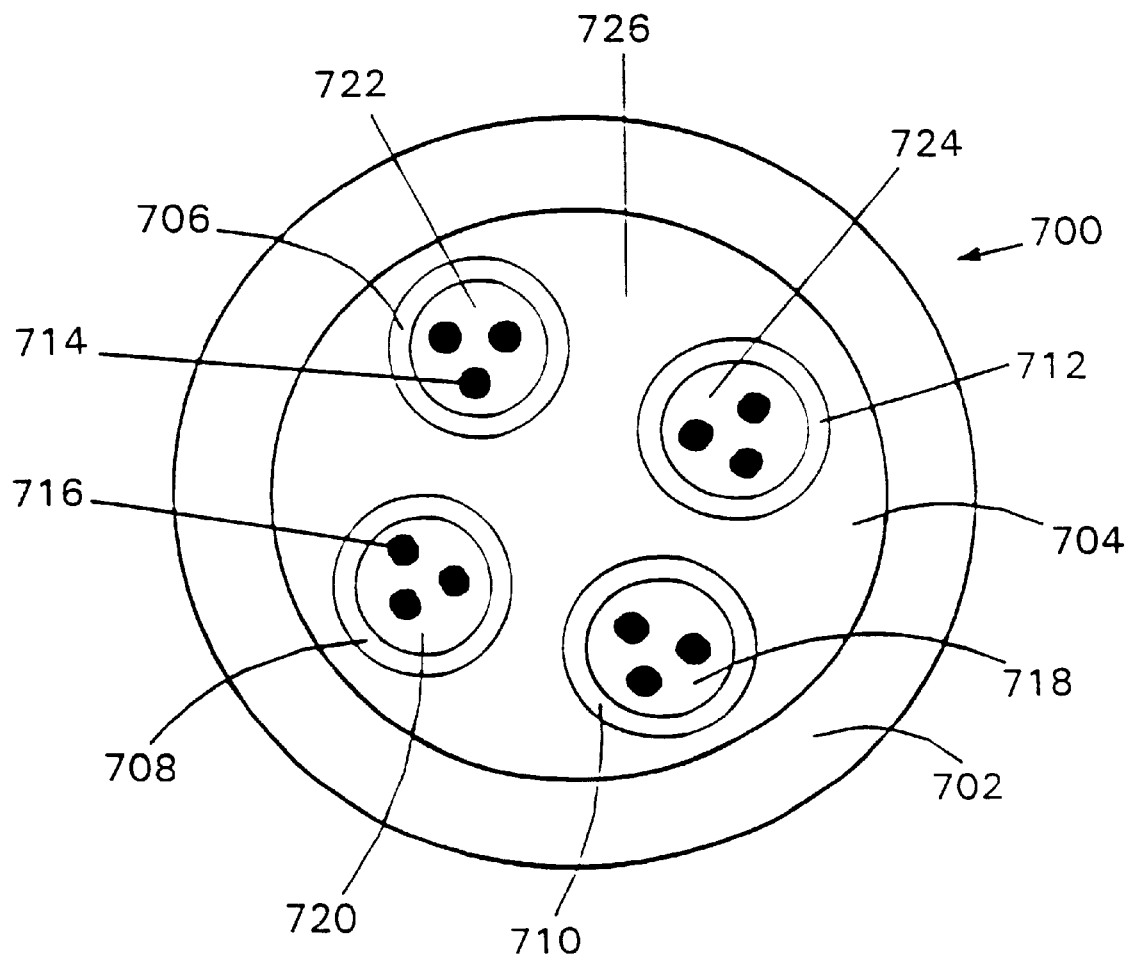
FIG. 7 is a schematic diagram of the cross-section of a composite article made in accordance with another preferred embodiment of the invention.
Figure 8:
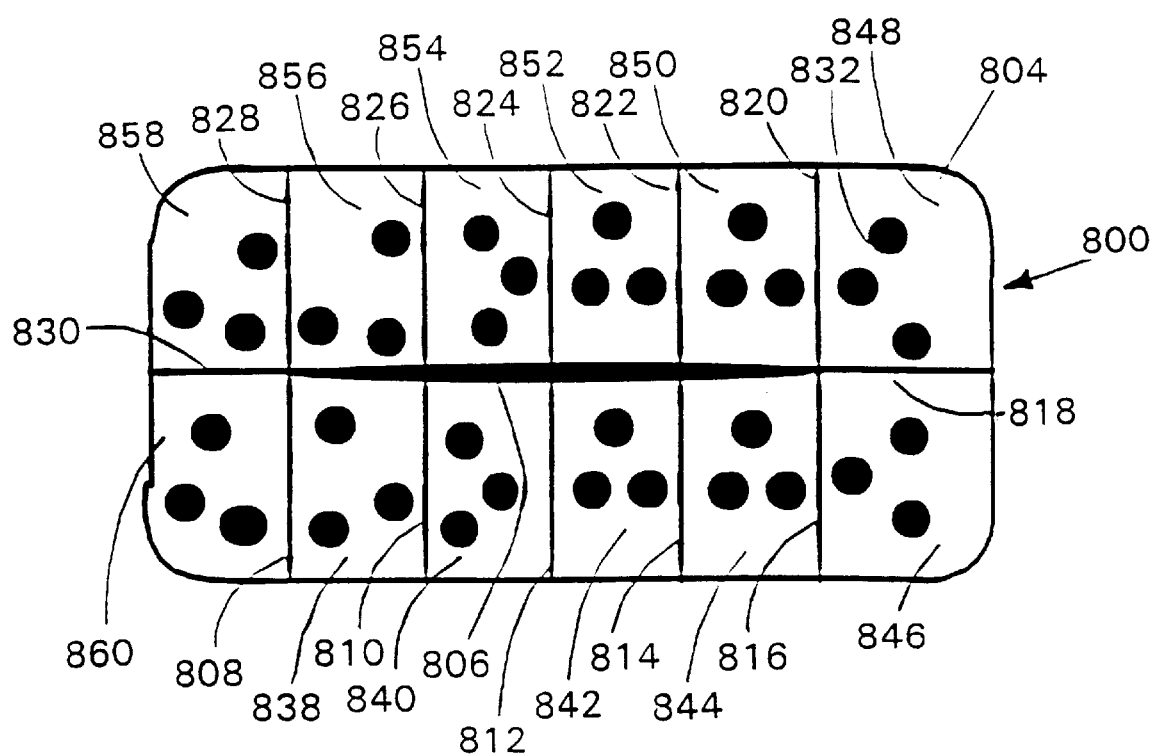
FIG. 8 is a schematic diagram of the cross-section of a composite intermediate made in accordance with another preferred embodiment of the invention.

FIGS. 7 and 8 illustrate alternate forms of multifilamentary composite articles manufactured in accordance with the invention. As shown in FIG. 7, the matrix portion 704 of round composite wire 700 is separated into a plurality of separate domains 718, 720, 722, 724, 726 by multiple filament decoupling layers 706, 708, 710, 712. The filament decoupling layers have a closed geometry in that each forms a closed loop in cross-section which completely encloses the cross-sections of one or more filaments 714, 716. The material for the filament decoupling layers is selected to be a material which is oxygen permeable under the activation conditions for the filaments. For example, zirconium or zirconium oxide filament decoupling layers may be used in combination with BSCCO 2223 filaments. In the embodiment shown, a plurality of filaments are embedded in each domain but in an alternate embodiment, each domain might contain a single filament. A jacketing layer 702 of conductive material surrounds the matrix. In an alternate embodiment, the jacketing layer may be a composite material including both conductive and non-conductive portions.

Figure 9:
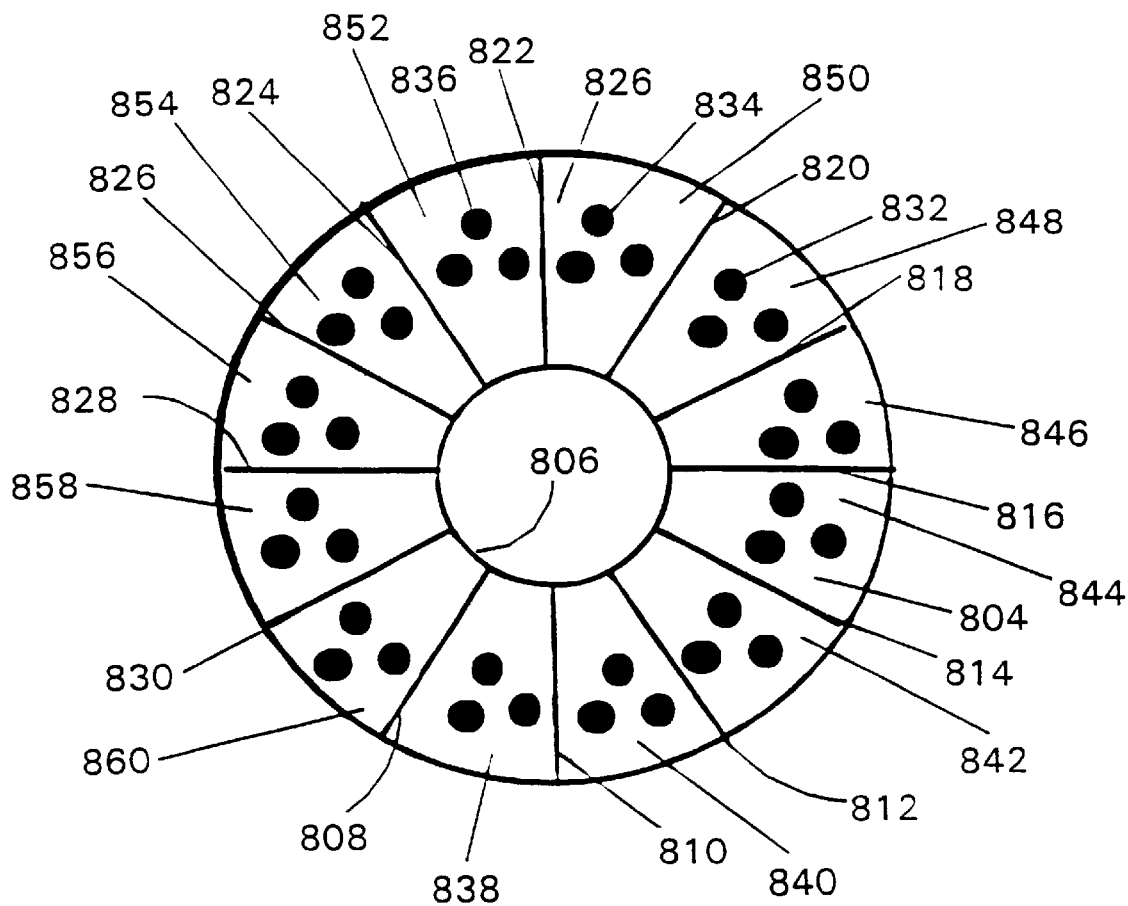
FIG. 9 is a schematic diagram of the cross-section of a composite article made from the intermediate of FIG. 8.

Turning now to FIG. 8, a highly aspected tape 800 is shown in which filament decoupling layer 806 forms a central spine and additional filament decoupling layers form radiating legs 808, 810, 812, 814, 816, 818, 820, 822, 824, 826, 828, 830 which separate the matrix 804 into domains 838, 840, 842, 844, 846, 848, 850, 852, 854, 856, 858, 860 each containing one or more filaments, for example filament 832, of superconducting oxide material As shown in FIG. 9, a tape in this form may be manufactured in accordance with the invention by first, forming a hollow tube having an outer wall 804 of a suitable matrix material and an inner wall comprising a filament decoupling layer 806; second, forming an intermediate by inserting additional filament decoupling layers 808, 810, 812, 814, 816, 818, 820, 822, 824, 826, 828, 830 at spaced intervals between the inner and outer walls of the tube and filling the remaining area inside the tube with the precursors of a desired superconducting oxide to form filaments, for example filaments 832, 834, 836. (One or more filaments may be included in each domain.); next, deforming the intermediate to flatten the tube, twist the filaments and texture the material comprised therein; and finally, thermomechanically processing the intermediate as described above. In one aspect of the invention, microcracking of the filament decoupling layers during the deformation step may provide improved oxygen access to the filaments during thermomechanical processing.

A round wire is shown in FIG. 7 and a rectangular tape is shown in FIG. 8, but articles in a variety of forms may be manufactured in accordance with the invention. Round filaments are shown in FIGS. 7 and 8 but any aspect ratio and any cross-section, such as square, hexagonal, octagonal, or trapezoidal, may equally be used. For superior AC performance, fine filaments should be used. By "fine filaments" are meant filaments with a maximum transverse cross-sectional dimension less than 750, and preferably less than 150 microns. High aspect ratio filaments, with an aspect ratio of about 10:1, and a thickness less than about 75 microns, may be used.

In manufacturing the superconducting composite articles in accordance with one aspect of the present invention, precursor powders and composite subunits may be formed using one of the standard PIT techniques. For example, nitrate powders comprising the precursors of BSCCO 2223 may be packed in standard silver billets, and extrusion and wire-drawing may be used to form hexagonal monofilamentary rods. A plurality of these rods may be assembled in a close-packed manner, and filament decoupling layers of oxide forming materials preferably selected from the group consisting of zirconium, niobium, molybdenum and their alloys may be inserted among the rods in a predetermined geometry to define a plurality of separate domains. The assembly steps may be repeated as often as required to obtain an intermediate composite with the desired number and arrangement of domains such as, for example, those shown in FIG. 1, 6 or 7. If a jacketing layer is desired, the entire assembly may be inserted into a conductive tube. Composites with up to 10,000 domains, but only a small number of fine filaments per domain, are preferred. A succession of deformation steps, including but not limited to drawing, twisting and rolling, may be used to reduce the diameter of the intermediate to a value in the range of from 0.01 inch to 0.12 inch (0.025 to 0.3 cm), and preferably 0.02 inch to 0.06 inch (0.05 to 0.153 and to obtain a desired twist pitch, preferably at least on the order of the width of the intermediate. In a preferred embodiment, the intermediate may be wire- drawn to a diameter in the range of 0.15 inch to 0.02 inch (0.038 to 0.05 cm) twisted to about 20 twists per inch (a twist pitch of 1.25 mm) and then rolled in one or more reduction passes to a maximum transverse cross-sectional dimension in the range of 0.05 inch to 0.005 inch (0.127 to 0.013 cm). If multiple deformations are performed, intermediate anneals will preferably be performed in between. In accordance with the invention, the intermediate may be subjected to a preliminary heat treatment step in an oxidizing atmosphere at a temperature of less than about 700 degrees C, and preferably less than about 550 degrees C, for up to 100 hours in order to oxidize the decoupling layers under conditions where the BSCCO precursors are kinetically limited. The intermediate may then be heat treated at 750 870 C for 1–100 hours at 0.001 to 1 atmosphere oxygen to promote texturing and achieve proper oxygenation of the BSCCO precursors. Then a final heat treatment may be performed in a 7.5% oxygen atmosphere at 828 to 832 C for 20 to 80 hours, 805 to 815 C for 1 to 240 hours and 787 to 795 C for 10 to 50 hours to form and sinter the desired 2223 material in the filament cores and to promote crack healing.

The invention may be further understood from the following examples:

EXAMPLES 1–8

Monofilament Rod Formation

Precursor powders were prepared from the solid state reaction of freeze-dried precursors of the appropriate metal nitrates having the nominal composition of 1.8:0.3:1.9:2.0:3.1 (Bi:Pb:Sr:Ca:Cu). $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase.

The powders were packed into silver sheaths having an inner diameter of 0.850 inch (2.16 cm) and a length of 8 inch (20.32 cm) and an outer diameter of 1.25 inch (3.18 cm) to form a billet. The billets were extruded to a diameter of ½ inch (1.27 cm). The billet diameter was narrowed with multiple die steps, with a final step drawn through a 0.70 inch (1.78 cm) hexagonally shaped die into a silver/precursor hexagonal wires.

INTERMEDIATE FORMATION

Eighteen of the wires were bundled together around a central nickel rod with a diameter of 0.070 inch (0.18 cm), which had previously been annealed for 2 hours at 600 C in a reducing atmosphere, and six nickel sheets, each made from a double thickness of 0.005 inch (0.013 cm) nickel foil (99.7% pure) were inserted among the wires to form six domains containing three wires each. In order to make a control composite, nineteen of the same wires were bundled together without nickel insertions. The two assemblages were inserted into opposite ends of a silver sheath having an inner diameter of 0.387 inch (0.98 cm) and an outer diameter of 0.42 inch (1.06 cm) to form a billet. The billet was drawn to 0.18 inch (0.46 cm) via successive 20% pass reductions and then annealed at 450 C in air for 4 hours, drawn to 0.072 inch (0.183 cm) via successive 20% and 10% pass reductions, annealed at 450 C in air for 2 hours, and finally drawn to 0.0.04 inch (1.02 cm) and annealed at 450 C in air for 4 hours to form a multifilamentary round intermediate. Two nickel-containing and two control portions (OX1026N with filament decoupling layers and OX1026 without) were then taken from the intermediate.

EXAMPLES 1–4

The first part of each was not twisted before it was rolled to a final thickness of 0.010 inch (0.25 cm) via a single reduction pass. It was then further separated longitudinally into 4 sections (Examples 1–4). Example 1 was ramped up to 400 C at 10 C/minute, to 700 C at 1 C/minute and then to 830 C at 0.1 C/minute in a 7.5% oxygen atmosphere and immediately given a final heat treatment in a 7.5% oxygen atmosphere at 830 C for 40 hours, 811 C for 40 hours and 787 C for 30 hours to form and sinter the desired 2223 material in the filament cores and produce a thin nickel oxide layer. Example 2 was ramped up to 500 C at 10 C/minute and immediately given a short high oxidation treatment at 500 C for 4 hours in a 100% oxygen atmosphere, then equilibrated at 500 C for 4 hours in a 7.5% oxygen atmosphere, followed by a ramp up to 830 C at 1 C/minute and the same final heat treatment used for Example 1, to form and sinter the desired 2223 material in the filament cores and produce a moderate nickel oxide layer. Example 3 was ramped up to 500 C at 10 C/minute and immediately given a long high oxidation treatment at 500 C for 4 hours in a 100% oxygen atmosphere and then equilibrated at 500 C for 16 hours in a 7.5% oxygen atmosphere, followed by followed by a ramp up to 830 C at 1 C/minute and the same final heat treatment used for Example 1 to form and sinter the desired 2223 material in the filament cores and produce a thick nickel oxide layer. Example 4 was ramped up to 450 C at 10 C/minute and then to 500 C at 2 C/minute in 100% oxygen atmosphere and given a high pressure oxidation treatment at 500 C for 20 hours at 100 atm (1500 psi), allowed to equilibrate to room temperature and pressure and then ramped up to 350 C at 10 C/minute and then to 400 C at 2 C/minute in 100% oxygen atmosphere and given an equilibration cycle at 400 C for 40 hours at 7.5%, followed by the same final heat treatment used for Example 1 to form and sinter the desired 2223 material in the filament cores and produce a very thick nickel oxide layer.

After the final heat treatment, the critical current of Examples 1–3 were measured at 77K, using a 1 $\mu$V/cm criteria and a 1cm voltage tap length. The critical currents of the experimental conductors were determined using a four-point probe technique. Engineering critical current densities were calculated for all samples as the measured critical current separated by the cross-sectional area of the wire. Averages reported are the averages of two samples. N indicates the samples which included filament decoupling layers. Thickness and width measurements are in inches.

| Wire ID | Thickness | Width | Ave Je | Ave Jc |
|---------|-----------|-------|--------|--------|
| Ex 1N   | 0.0105    | 0.084 | 322    | 1109   |
| Ex 2N   | 0.01      | 0.084 | 474    | 1635   |
| Ex 3N   | 0.0104    | 0.081 | 780    | 2690   |
| Ex 1    | 0.0104    | 0.07  | 1094   | 3388   |
| Ex 2    | 0.0099    | 0.067 | 2048   | 6341   |

The results show that composites containing filament decoupling layers can be made to superconduct, and suggest that increased oxidation provides increased engineering critical current density, whether or not the samples include a filament decoupling layer.

EXAMPLES 5–8

The second part of the nickel-containing intermediate (OX1026NAT) was twisted to 3.0 twists/inch (1.181 twists/cm) using a hand drill and then rolled to a final thickness of 0.010 inch (0.025 cm) via successive 5% thickness reduction passes with 2 intermediate anneals—1 hour at 450 C in air at a thickness of 0.025 inch (0.063 cm) and 4 hours at 450 C in air at a thickness of 0.156 inch (0.053 cm) to form an intermediate article.

EXAMPLE 9

A multifilamentary composite intermediate article may be made using filament decoupling layers in the form of insulating materials and the intermediate then processed to form a superconducting composite. Boron nitride or tungsten carbide powders may be packed into six silver sheaths, each having an inner diameter of 0.850 inch (2.16 cm) and a length of 8 inch (20.32 cm) and an outer diameter of 1.25 inch (3.18 cm) to form six billets. Alternatively, powders of titanium carbide, silicon carbide, alumina, silicon nitride, boron carbide, zirconium oxide, titanium nitride, yttrium oxide, or magnesium oxide may be used. Each billet may be drawn by a series of 10% reduction passes to a diameter of 0.200 inch (0.51 cm) and then rolled by a series of 10% reduction passes to a tape with a thickness of 0.005 inch (0.013 cm). Each of these tapes may be used as a filament decoupling layer.

Hexagonal monofilamentary wires of silver/BSCCO 2223 precursor may be prepared as described in Examples 1–8. Each of the tapes may be bent into the shape of a gutter and three wires placed in it. Then the six bent tapes may be bundled together, with their open sides facing outwards, around a central silver rod with a diameter of 0.070 inch (0.178 cm), to form six separate domains containing three wires each, and the entire assembly inserted into a tubular silver jacketing layer having an inner diameter of 0.387 inch (0.982 cm) and an outer diameter of 0.42 inch (1.067 cm) to form a billet. The billet may be drawn to 0.18 inch (0.457 cm) via successive 20% pass reductions and then annealed at 400 C in air for 1 hour, drawn to 0.072 inch (cm) via successive 20% and 10% pass reductions, annealed at 400 C in air for 1 hour, and finally drawn to 0.0.04 inch (0.102 cm) and annealed at 400 C in air for 1 hour to form a multifilamentary round intermediate. Since the insulating materials in the filament decoupling layers will already be fully passivated, Example 9 may be thermomechanically processed by ramping up to 830 C at 1 C/minute in a 7.5% oxygen atmosphere and immediately giving a final heat treatment in a 7.5% oxygen atmosphere at 830 C for 40 hours, 811 C for 40 hours and 787 C for 30 hours to form and sinter the desired 2223 material in the filament cores.

EXAMPLE 10

A multifilamentary YBCO composite intermediate article may be made using filament decoupling layers in the form of alumina scale formers and the intermediate then processed to form a superconducting composite. In this embodiment, the precursor may be prepared as described in U.S. Pat. No. 5,034,373 or U.S. patent application Ser. No. 07/881,675 filed May 12, 1992, which are incorporated herein by reference. An alloy of Y—Ba—Cu—Ag or Y(Ca)—Ba—Cu—Ag, with, preferably the appropriate stoichiometry of metallic constituents to form a 1–2–4 type oxide superconductor, may be packed as a powder into a silver sheath having an inner diameter of 0.05 inch (1.25 cm), a length of 8 inch (20.32 cm), and an outer diameter of 0.06 inch (1.57 cm). Silver powder, typically comprising 10–50 weight % of the total powder, should be included with the alloy. The packed billet may be welded shut under a protective atmosphere and then reduced in diameter by warm hydrostatic extrusion at 325C to form monofilamentary wires.

Eighteen of the wires may be bundled together around a central aluminum/copper alloy rod [10% aluminum, 90% copper] with a diameter of 0.070 inch (0.18 cm), which had previously been annealed for 2 hours at 600 C in a reducing atmosphere, and six sheets of the same aluminum/copper alloy, each made from a double thickness of 0.005 inch (0.127 cm) foil (99.7% pure) may be inserted among the wires to form six domains containing three wires each. The bundle may be drawn to 0.18 inch (0.46 cm) via successive 20% pass reductions and then annealed at 450 C in air for 4 hours, drawn to 0.072 inch (0.18 cm) via successive 20% and 10% pass reductions, annealed at 450 C in air for 2 hours, and finally drawn to .04 inch (0.10 cm) and annealed at 450 C in air for 4 hours to form a multifilamentary round intermediate. The intermediates may be rebundled with additional aluminum/copper alloy sheets and rods, and the reduction process repeated as often as desired to obtain an intermediate of the desired dimensions with the desired number of domains. The resulting intermediate may be thermomechanically processed by oxidizing in pure oxygen at 500 C for 300–400 hours, and then deformed at room temperature by 2 to 6 iterations of, for example, pressing at 13,000 to 35,000 pounds load force or rolling by successive 10 to 20% pass reductions alternating with anneals for 0.1 to 10 hours at 650–800 C to obtain a multifilamentary superconducting composite.

EXAMPLE 11

A multifilamentary BSCCO 2212 composite intermediate article may be made using closed zirconium filament decoupling layers and the intermediate then processed to form a superconducting composite. In this embodiment, the precursor may be prepared as described in Phase Alignment in Ag-Clad 2212 Bi—Sr—Ca—Cu—O Wires, R. D. Ray II & E. E. Hellstrom, *Applied Physics Letters*, 57, 2948–2950 (1990), which is incorporated herein by reference. Precursor powders may be prepared from reagent grade $Bi_2O_3$, $CaCO_3$, $SrCO_3$, and CuO powders with a nominal Bi:Sr:Ca:Cu mole ration of 2:2:1:2. After thoroughly mixing the powders in the appropriate ratio, a multistep treatment (typically 3–4 steps) of calcination (800° C.–825° C., for a total of 48 h), isostatic pressing (280 MPa) and intermediate grinding may be performed in order to remove residual carbon, homogenize the material and generate a BSCCO 2212 oxide superconductor phase.

The powders may be packed into zirconium-coated silver sheaths having, for example, an inner diameter of 0.850 inch (2.16 cm) and a length of 8 inch (20.32 cm) and an outer diameter (silver layers) of 1.25 inch (3.18 cm) and a sputtered 2 micron thick outer coating of zirconium to form billets and drawn to 0.055 inch (0.138 cm) via one or more pass reductions, with one or more intermediate anneals at 400 C in air for 1 hour. Six of the billets may be bundled together around a central silver rod with a diameter of 0.070 inch (0.18 cm) and the entire assembly inserted into a tubular silver jacketing layer having an inner diameter of 0.170 inch (0.43 cm) and an outer diameter of 0.210 inch (0.53 cm) to form a composite billet. The billet may be drawn to a 0.055 inch (0.138 cm) diameter round via one or more pass reductions with one or more intermediate anneals at 400 C in air for 1 hour, twisted to a 2.54 inch (1 cm) twist pitch, annealed as before, and finally rolled to a final cross-section of about 0.12 inch (0.3 cm) by 0.004 inch (0.01 cm) to form a multifilamentary intermediate article.

The intermediate may be heated at 5C/min to 920 C, held for 15 minutes, cooled at 10 to 240 C to 840 C, annealed at 840 C for 70 hours, all in air and finally air cooled at room temperature to obtain a multifilamentary superconducting composite tape.

The various features and advantages of the invention may be seen from the foregoing description. Iterative variations on the processes described above, such as changes in the parameters, number and order of the torsional and conventional texturing steps will be seen to be within the scope of the invention. Many modifications and variations in the preferred embodiments illustrated will undoubtedly occur to those versed in the art, as will various other features and advantages not specifically enumerated, all of which may be achieved without departing from the spirit and scope of the invention as defined by the following claims.

What is claimed is:

1. A process for manufacturing a multifilimentary superconducting article comprising the steps of:

first, forming a composite having multiple domains disposed therein, the multiple domains being substantially electrically decoupled from each other, the composite comprising:
   a matrix comprising a noble metal;
   fine filaments of a material selected from the group consisting of superconducting oxide materials and precursors of superconducting oxide materials, the fine filaments being embedded in the matrix; and
   discrete filament decoupling layers comprising a material selected from the group consisting of electrically insulating materials and predecessors of electrically insulating materials, the discrete filament decoupling layers being embedded in the matrix to define the multiple domains, each of the multiple domains including a portion of the matrix material and at least one of the fine filaments embedded in the portion of the matrix material, and each of the multiple domains being separated from other domains by at least one of the discrete filament decoupling layers so that the multiple domains are substantially electrically decoupled from each other; and then, thermomechanically processing the composite at conditions sufficient to produce at least one effect selected from the group consisting of texturing, crack healing and, if a precursor of the superconducting oxide remains, phase transformation of the precursor of the superconducting oxide to the superconducting oxide.

2. A process according to claim 1 wherein the fine filaments comprise a precursor of a superconducting oxide material.

3. A process according to claim 2 wherein the precursor of the superconducting oxide material comprises copper in combination with yttrium, barium, bismuth, lead, strontium, calcium, thallium or mercury.

4. A process according to claim 2 wherein the precursor of the superconducting oxide material comprises copper and oxygen in combination with yttrium, barium, bismuth, lead, strontium, calcium, thallium or mercury.

5. A process according to claim 3 wherein the precursor of the superconducting oxide material comprises copper in combination with bismuth, lead, strontium and calcium.

6. A process according to claim 4 wherein the precursor of the superconducting oxide material comprises copper and oxygen in combination with bismuth, lead, strontium and calcium.

7. A process according to claim 3 wherein the precursor of the superconducting oxide material comprises copper in combination with yttrium and barium.

8. A process according to claim 3 wherein the precursor of the superconducting oxide material comprises copper and oxygen in combination with yttrium and barium.

9. A process according to claim 1 wherein the fine filaments comprise a superconducting oxide material.

10. A process according to claim 9 wherein the superconducting oxide material comprises an oxide superconductor selected from the group consisting of the bismuth oxide superconductors, thallium oxide superconductors. mercury oxide superconductors, yttrium oxide superconductors and rare earth oxide superconductors.

11. A process according to claim 10 wherein the superconductor comprises an oxide superconductor selected from the group consisting of the bismuth oxide superconductors and yttrium oxide superconductors.

12. A process according to claim 1 further comprising a step of forming a conducting jacketing layer surrounding the matrix.

13. A process according to claim 1 wherein the discrete filament decoupling layers comprise a predecessor of an electrically insulating material and the thermomechanical processing step comprises the step of forming the electrically insulating material from the predecessor of the electrically insulating material.

14. A process according to claim 13 wherein the thermomechanial processing step comprises the steps of:

first heat treating the composite at conditions sufficient to passivate the predecessor of the electrically insulating material to form the electrically insulating material from at least part of the predecessor of the electrically insulating material without inducing substantial phase transformation in the material from which the fine filaments are formed and activating the fine filaments by thermomechanically processing the composite at conditions sufficient to produce at least one effect selected from the group consisting of texturing crack healing and, if a precursor to the desired superconducting oxide remains, phase transformation in the filament material.

15. A process according to claim 14 wherein the discrete filament decoupling layers comprise at least one oxide forming material selected from the group consisting of the transition metals, the alkaline earths, titanium, zirconium, niobium, molybdenum, aluminum, and their alloys.

16. A process according to claim 15 wherein the discrete filament decoupling layers consist essentially of at least one oxide forming material selected from the group consisting of the transition metals, the alkaline earths, titanium, zirconium, niobium, molybdenum, aluminum, and their alloys.

17. A process according to claim 16 wherein the discrete filament decoupling layers consist essentially of at least one material selected from the group consisting of zirconium, niobium, molybdenum, hafnium, tantalum, tungsten, titanium, vanadium, manganese, cobalt, iridium, vanadium nickel, iron chromium and their alloys.

18. A process according to claim 17 wherein the discrete filament decoupling layers consist essentially of at least one material selected from the group consisting of nickel, iron zirconium, niobium, molybdenum, and their alloys.

19. A process according to claim 14 wherein the heat treatment step is continued until the predecessor of the electrically insulating material is essentially completely passivated by formation of an oxide layer between the filament and the matrix prior to activation of the fine filaments.

20. A process according to claim 19 wherein the heat treatment step comprises the step of heat treatment in an oxidizing atmosphere at a temperature of less than about 700 degrees C for up to 100 hours.

21. A process according to claim 20 wherein the heat treatment step comprises the step of heat treatment in an oxidizing atmosphere at a temperature of less than about 550 degrees C for up to 100 hours.

22. A process according to claim 21 wherein the fine filaments are activated by thermomechanical processing prior to complete passivation of the predecessor of the electrically insulating material substantially without the oxygen flux associated with the passivation reactions under the thermomechanical processing conditions interfering with phase transformations.

23. A process according to claim 22 wherein at least a portion of the thermomechanical processing of the composite is done at oxygen pressures in excess of 10 atmospheres.

24. A process according to claim 1 wherein the discrete filament decoupling layers comprise an electrically insulating material and the thermomechanical processing step includes the step of processing the composite at conditions selected so that any activation of the insulating material is done without significantly impairing the electrically insulating properties of the electrically insulating material or interfering with phase transformations of the material from which the fine filaments are formed.

25. A process according to claim 24 wherein the discrete filament decoupling layers comprise a material selected from the group consisting of elemental oxides, sulfides, and nitrides, semiconductors and intermetallics.

26. A process according to claim 25 wherein the discrete filament decoupling layers comprise a material selected from the group consisting of boron nitride, tungsten carbide, titanium carbide, silicon carbide, alumina, silicon nitride, boron carbide, zirconium oxide, titanium nitride, yttrium oxide and magnesium oxide.

27. A process for manufacturing a multifilamentary superconducting article comprising the steps of first, forming a composite having domains that are substantially electrically decoupled from each other, the composite comprising
  a matrix, which substantially comprises a noble metal,
  a plurality of discrete filament decoupling layers, each of the plurality of discrete filament decoupling layers comprising a material selected from the group consisting of electrically insulating oxide materials and predecessors of electrically insulating oxide materials, the plurality of discrete filament decoupling layers being disposed within the matrix to define the domains, and
  a plurality of fine filaments, each of the fine filaments comprising a material selected from the group consisting of bismuth oxide superconductors, precursors of bismuth oxide superconductors, yttrium oxide superconductors and precursors of yttrium oxide superconductors, each of the plurality of fine filaments being disposed within and essentially encapsulated by the matrix and chemically isolated thereby from the plurality of discrete filament decoupling layers, each of the domains containing a portion of the matrix material and at least one filament disposed in the portion of the matrix material,
    wherein the plurality of discrete filament decoupling layers are disposed in the matrix so that the domains are substantially electrically decoupled from each other;
  deforming the composite to produce at least one effect selected from the group consisting of twisting the fine filaments and texturing the material comprised therein;
  forming a conductive jacketing layer surrounding the matrix, and
  thermomechanically processing the composite at conditions sufficient to produce at least one effect selected from the group consisting of forming and passivating an insulating material in the decoupling layers and texturing, crack healing and, if a precursor to the superconducting oxide remains, phase transformation of the precursor of the superconducting oxide to the superconducting oxide.

28. The method of claim 27, wherein:

the matrix comprises a noble metal;

the filaments comprise a superconducting oxide material; and the filament decoupling layers comprise an electrically insulating material.

29. A method, comprising:

forming a composite having domains disposed therein, the domains being substantially electrically decoupled from each other, the composite comprising:
  a matrix;
  filaments of a material selected from the group consisting of superconducting oxide materials and precursors of superconducting oxide materials, the filaments being embedded in the matrix; and
  filament decoupling layers comprising a material selected from the group consisting of electrically insulating materials and predecessors of electrically insulating materials, the filament decoupling layers being disposed within the matrix to define the domains, each domain including a portion of the matrix and at least one of the filaments embedded in the portion of the matrix and each domain being separated from other domains by at least one of the discrete filament decoupling layers so that the domains are substantially electrically decoupled from each other.

* * * * *

UNITED STATES PATENT AND TRADEMARK OFFICE
CERTIFICATE OF CORRECTION

PATENT NO. : 6,393,690 B1
DATED : May 28, 2002
INVENTOR(S) : Gregory L. Snitchler et al.

It is certified that error appears in the above-identified patent and that said Letters Patent is hereby corrected as shown below:

<u>Column 4,</u>
Line 34, "nickel,iron" should be -- nickel, iron --.
Line 35, "nickel,iron" should be -- nickel, iron --.

<u>Column 5,</u>
Line 4, insert -- , -- after "750".

<u>Column 7,</u>
Line 35, "nickel,iron" should be -- nickel, iron --.
Line 36, "nickel,iron" should be -- nickel, iron --.
Line 40, insert -- , -- after "matrix".

<u>Column 8,</u>
Line 8, change ":" to -- ; --.
Line 41, "desire" should be -- desired --.

<u>Column 9,</u>
Line 23, "filamentimatrix" should be -- filament/matrix --.

<u>Column 10,</u>
Line 20, insert -- as -- after "such".

<u>Column 13,</u>
Line 37, insert -- . -- after "material".

<u>Column 14,</u>
Line 25, insert -- cm), -- after "0.153".
Line 42, insert -- to -- between "750" and "870".

<u>Column 15,</u>
Line 25, "0.0.04" should be -- .0.04 --.
Line 54, delete "followed by".

<u>Column 17,</u>
Line 2, "0.0.04" should be -- .0.04 --.

UNITED STATES PATENT AND TRADEMARK OFFICE
CERTIFICATE OF CORRECTION

PATENT NO. : 6,393,690 B1
DATED : May 28, 2002
INVENTOR(S) : Gregory L. Snitchler et al.

It is certified that error appears in the above-identified patent and that said Letters Patent is hereby corrected as shown below:

Column 19,
Line 43, insert -- oxide -- after "the".

Column 20,
Line 1, insert -- , -- after "texturing".

Signed and Sealed this

Twenty-eighth Day of January, 2003

JAMES E. ROGAN
*Director of the United States Patent and Trademark Office*